United States Patent [19]

Kosugi

[11] Patent Number: 5,231,054
[45] Date of Patent: Jul. 27, 1993

[54] METHOD OF FORMING CONDUCTIVE MATERIAL SELECTIVELY

[75] Inventor: Makoto Kosugi, Isehara, Japan
[73] Assignee: Fujitsu Limited, Japan
[21] Appl. No.: 621,148
[22] Filed: Dec. 3, 1990

[30] Foreign Application Priority Data

Dec. 20, 1989 [JP] Japan .................................. 1-330402

[51] Int. Cl.$^5$ ........................................... H01L 22/44
[52] U.S. Cl. .................................. 437/192; 437/194; 437/195
[58] Field of Search ........................ 437/192, 194, 195

[56] References Cited

U.S. PATENT DOCUMENTS

| | | | |
|---|---|---|---|
| 4,746,621 | 5/1988 | Thomas et al. | 437/195 |
| 4,789,648 | 12/1988 | Chow et al. | 437/195 |

FOREIGN PATENT DOCUMENTS

| | | |
|---|---|---|
| 0261846 | 3/1986 | European Pat. Off. |
| 0195977 | 10/1986 | European Pat. Off. |
| 0359109 | 3/1990 | European Pat. Off. |
| 0391562 | 10/1990 | European Pat. Off. |
| 0397462 | 11/1990 | European Pat. Off. |
| 61-139026 | 6/1986 | Japan . |
| 64-77131 | 3/1989 | Japan . |

OTHER PUBLICATIONS

S. Wolf et al., *Silicon Processing for the VLSI Era*, vol. 1, Lattice Press Sunset Beach, 1986, pp. 399-404.

T. Ohba et al., *Materials Research Society*, 1987, "Evaluation On Selective Deposition of CVD W Films By Measurement of Surface Temperature", Kawasaki Japan.

T. Ohba et al., *IEEE*, 1987, pp. 213-216, "Selective CVD Tungsten Silicide For VLSI Applications", Kawasaki, Japan.

*Primary Examiner*—Brian E. Hearn
*Assistant Examiner*—Laura M. Holtzman
*Attorney, Agent, or Firm*—Nikaido, Marmelstein, Murray & Oram

[57] ABSTRACT

The CVD W deposition process is observed while changing the substrate temperature, with IR thermometer measurement. The temperature indicated changes with emissivity depending on the surface morphology and materials.

As the response time of this measurement is short, it is possible to perform in situ observation of changing surface morphology. This is a valid method to evaluate the deposition process. On a silicon substrate, the indicated temperature increases rapidly as soon as the gas flow starts, i.e. as soon as tungsten is deposited on the substrate. The indicated temperature increases in two steps. One is for silicon reduction and the other is for hydrogen reduction. Furthermore, it is found that the start of deposition on insulators is delayed. This phenomenon is related to the selective deposition. The thickness of deposited tungsten films can on insulators be estimated by measuring the delay time and the thickness of tungsten on silicon.

The reaction process for silicon and hydrogen reduction is evaluated by this method. We found that within 10 seconds the silicon reduction was finished and the hydrogen reduction started. We also found that optimum silicon reduction enhances the selectivity.

15 Claims, 5 Drawing Sheets

METHOD OF FORMING CONDUCTIVE MATERIAL SELECTIVELY

BACKGROUND OF THE INVENTION

The present invention relates to a method for selectively forming a conductive material, and particularly to a method of forming multilevel interconnections for a semiconductor device. More particularly, the present invention relates to a method for forming via plugs within vila hiles which electrically connects a lower layer wiring to an upper layer wiring in a multilevel interconnect structure.

Current requirements for high speed operation in computer systems have demanded greater improvements in the high-level integration and high-speed operation of a semiconductor integrated circuits. Therefore, both the microminiaturization of semiconductor devices, and the microminiaturization and multilayered structure of wirings are considered more and more important.

In order to realize such multilevel interconnect structures, developments in the techniques for planarizing interlevel dielectric films and in the techniques for forming wirings in fine miniaturized holes used in connecting layers of multilevel interconnect structures are particularly important. Greater reliability in multilevel interconnections may be improved by perfecting such techniques.

Some planarization methods for the interlevel dielectric film formation of conventional multilevel interconnect structures include the organic resin coating method, SOG (spin on glass) coating method, etchback method and bias sputterizing method. Among these methods, the planarization method by coating an organic resin is a very simple process, and, has superior planarization characteristics.

For forming multilevel interconnections, plugs are formed by filling fine via holes formed on the interlevel dielectric film with conductive material. Usually, the selective CVD (Chemical Vapor Deposition) method with tungsten (W) using tungsten hexafluoride ($WF_6$) as the source gas and hydrogen ($H_2$) or silane ($SiH_4$) as the reduction agent has been used to form such plugs. This method has been described, for example, in the reference IEEE IEDM Technical Digest (1987) by T. Ohba, S. Inoue and M. Maeda.

Tungsten (W) deposited on the bottom of the via holes forms well on exposed conductor surfaces such as metal, but W is difficult to deposit on inorganic dielectric films. This is referred to as when the deposition of W has "good selectivity". Enhancing the reliability of multilevel interconnections requires "good selectivity". For this purpose, PSG (Phosphor Silicate Glass) films or silicon dioxide ($SiO_2$) films formed through the thermal CVD method are excellent inorganic dielectric films. However, good selectivity cannot be obtained with $SiO_2$ films and silicon nitride ($Si_3N_4$) films which are formed using either a sputtering method and plasma CVD method.

It has been assumed that a desired via plug for via hole can be attained when selective CVD of tungsten W is performed on $SiO_2$ film or PSG formed by thermal CVD on an organic resin film coated for planarization. However, the $SiO_2$ film and PSG formed by the thermal CVD method on the organic resin film have inferior adhesion properties compared to organic resin films and have weak mechanical strength. As a result, the reliability of the wiring is lower because peeling and/or cracks can occur in the course of the manufacturing process.

Recently, however, it has been disclosed by the Japanese Laid-open Patent No. 77131/1989 (by Fukuyama, et al) that a planar dielectric film ensuring good adhesion may be obtained by forming an inorganic dielectric film on the planarized resin film using an ion beam assisted deposition method. However, as explained above, assuming from the fact that CVD having good selectivity cannot be obtained for the $SiO_2$ film or $Si_3N_4$ film formed by the sputtering method of plasma CVD method, it has been thought that CVD having good selectivity also cannot be obtained for the $SiO_2$ film or $Si_3N_4$ film formed using the ion beam assisted deposition method.

SUMMARY OF THE INVENTION

It is the first object of the present invention to provide a deposition method having good selectivity for forming conductive material films.

It is the second object of the present invention to improve the reliability of the method for forming multilevel interconnections for large-scale integrated semiconductor circuit.

These objects may be attained by realizing the processes explained hereunder, namely the process for forming a first metal wiring on a semiconductor substrate; the process for forming a dielectric film such as an organic resin film on a semiconductor substrate and planarizing the dielectric film; the process for forming an inorganic dielectric film such as silicon dioxide ($SiO_2$) as the upper most dielectric layer on the dielectric film using the ion beam assisted deposition method; the process for forming via holes on a first metal wiring through said upper most dielectric layer and said dielectric film; the process for selectively filling connection metal (plug) for the first metal wiring in the via hole; and the process for forming a second metal wiring on the upper most dielectric layer covering the via hole.

As the upper most layer of a planarized dielectric film, the dielectric film layer formed by the ion beam assisted deposition method is used. The dielectric film formed by the ion beam assisted deposition method is superior not only in adhesion with the base dielectric film, but also in mechanical strength because of the higher packing density of the film.

Moreover, the dielectric film formed by the ion beam assisted deposition method is also superior in selectivity for selectively filling the metal plug in the via hole using the CVD method.

As explained above, reliability of multilevel interconnections may be markedly increased through the combination of techniques for the planarization of interlevel dielectric films and the filling of metal plugs with good selectivity in the via hole.

DESCRIPTION OF THE PREFERRED EMBODIMENT

Figure 1:
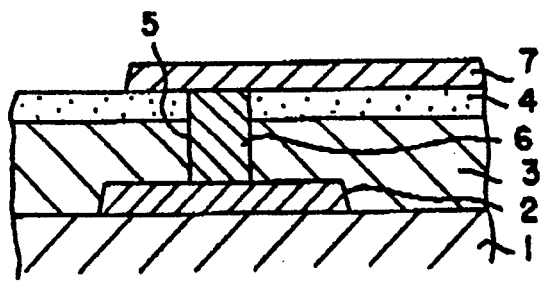
FIG. 1 is a schematic sectional view for explaining the principal of the present invention.

A preferred embodiment of the present invention will be explained in detail with reference to FIG. 1 to FIG. 6. Like elements are designated by like reference numerals and characters among and throughout the drawings.

FIG. 1 is a schematic sectional view for explaining the principal of the present invention. In this figure, numeral 1 denotes a semiconductor substrate; 2, a first metal wiring; 3, a dielectric film; 4, an upper most dielectric film layer; 5, a via hole, 6, a metal plug for connection; and 7, a second metal wiring.

Such a structure may be obtained by the following processes. A first metal wiring 2 is formed on a semiconductor substrate 1. A dielectric film 4 is then formed on the semiconductor substrate 2 covering this metal wiring 2, and the surface of the film is planarized. Moreover, an upper most dielectric film layer 4 is formed on the dielectric film 3 using the ion beam assisted deposition method. Next, a via hole 5 is formed to the first metal wiring 2 through the upper most dielectric film layer 4 and the dielectric film 3. After a metal plug 6 for connection is selectively filled into the via hole 5, a second metal wiring 7 is formed on the upper most dielectric film layer 4.

Figure 2:
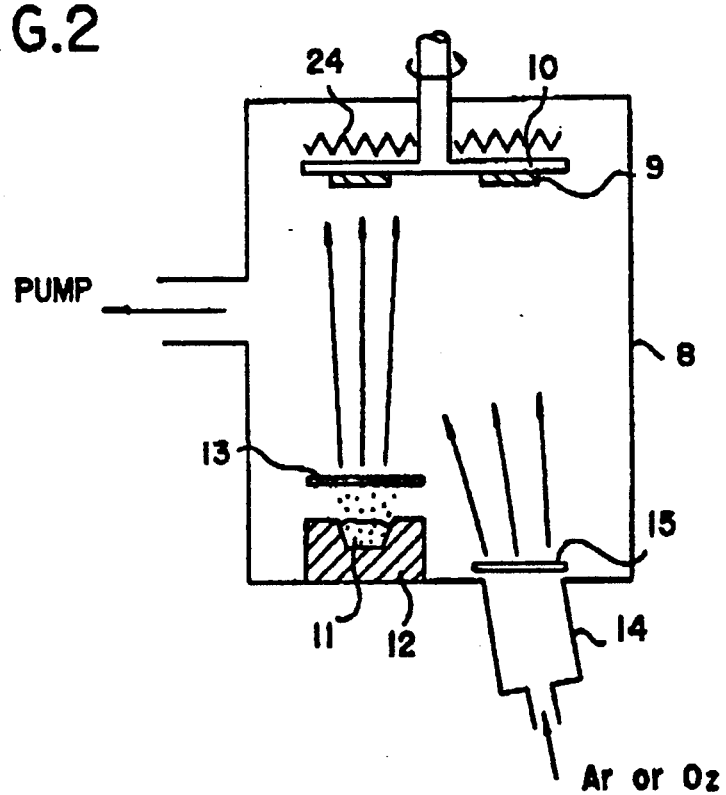
FIG. 2 shows an ion beam assisted deposition apparatus to be used to form an upper most dielectric layer.

Here, the ion beam assisted deposition apparatus used to form the upper most dielectric film layer 4 is schematically shown in FIG. 2. In this figure, numeral 8 denotes a vacuum chamber made of stainless steel; 9 a substrate; 10 a substrate holder; 24, a substrate heater; 11, an evaporation source; 12, a crucible; 13, an evaporation beam shutter; 14 an ion source; and 15, an ion source shutter.

The vacuum chamber 8 is evacuated using a vacuum pump though an evacuation port, and is kept at about $1 \times 10^{-8}$ Torr. The evaporation source 11 is heated by an electron beam heater (not illustrated), and the vaporized source beam reaches the surface of semiconductor substrate 9 for deposition. The evaporation beam quantity reaching the surface of the substrate 9 is controlled through the evaporation quantity by a evaporation beam shutter 13. Meanwhile, the accelerated argon ion or oxygen ion beam is emitted from an ion source 14 and reaches the surface of semiconductor substrate 9 to enhance adhesion of the deposited film to the substrate 9 so as to make the deposited film itself dense. The quantity of ions in the ion beam is controlled by an ion source shutter 15 which operates in conjunction with the evaporation beam shutter 13. Since a substrate holder 10 for holding the semiconductor substrate 9 is rotated around the center axis thereof, a deposited film having good uniformity can be obtained.

In this preferred embodiment, PMSS (Silylated Poly-Methyl Silsesquioxane) which is a type of silicon resin is used on the semiconductor substrate 2 as the dielectric film 3 provided for planarizing the surface. The SiO₂ film is used as the upper most dielectric film layer 4 formed by the ion beam assisted deposition method on the PMSS film.

Figure 3:
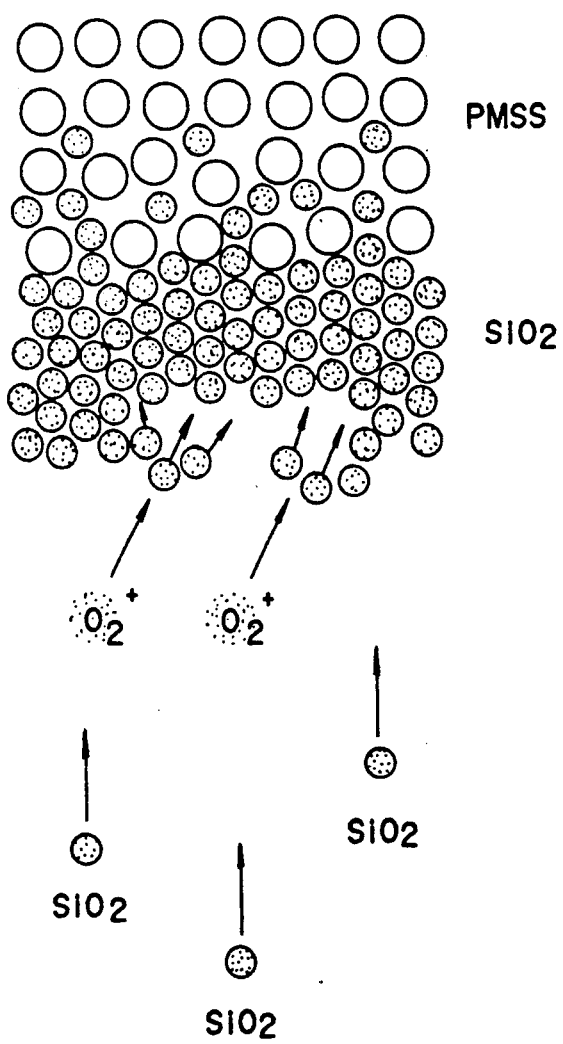
FIG. 3 is a schematic diagram showing a film forming process using the ion beam assisted deposition method.

FIG. 3 schematically shows a film forming process where the SiO₂ film is formed on the PMSS film using the ion beam assisted deposition method. When the SiO₂ film is formed by a conventional evaporation method, the kinetic energy of SiO₂ molecules vaporized from the evaporation source is about 0.2 eV. On the other hand, when using the ion beam assisted deposition method, the SiO₂ molecules are given a kinetic energy of about 1.0 KeV from the oxygen ions irradiated from the ion source. In this case, since the SiO₂ molecules deposited on the PMSS film have sufficient kinetic energy for migration on the surface, defective portions such as voids generated on the surface during formation of the film can be filled with such SiO₂ molecules. Namely, a dense film quality can be obtained and the surface can always be kept in a relatively flat condition. In addition, as shown in the same figure, the SiO₂ molecules some of which have a large kinetic energy also enter the PMSS film. Thereby, adhesion of the SiO₂ film to the PMSS film increased in comparison with that when conventional evaporation is used. Moreover, nucleation sites generated through the coupling of dangling bonds do not form defective portions and among the metal atoms.

Next, the process of the actual formation of a multilevel interconnect structure will be explained with reference to FIGS. 4(a) to 4(f).

Figure 4A:
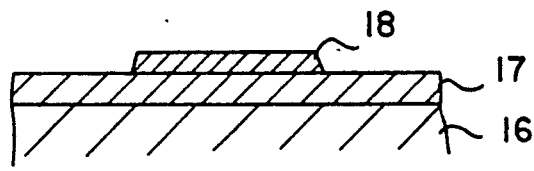
FIG. 4(a) is a schematic sectional view of the condition where a Ti/Au film is formed as a first metal wiring.

As shown in FIG. 4(a), a SiO₂ film is formed with a thickness of 1 μm on a silicon (Si) substrate using the plasma CVD method. Titanium(Ti) film with a thickness of 10 nm and then a Gold (Au) film with a thickness of 700 nm are sequentially formed thereon using the sputtering method. A Ti/Au film 18 used as the first metal wiring is then formed by patterning that film.

Figure 4B:
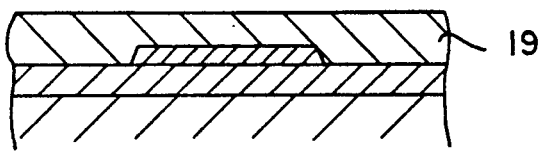
FIG. 4(b) is a diagram showing a step in forming a PMSS film and planarizing the surface thereof.

As shown in FIG. 4(b), the PMSS film 19 is coated with a thickness of 1.5 μm using the spin coating method and the flat surface can then be obtained by baking the PMSS film 19 through heating thereof for about an hour at about 350° C.

Figure 4C:
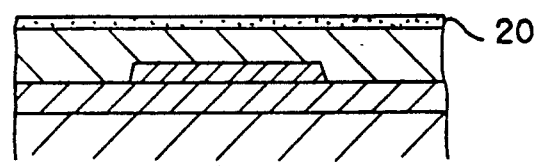
FIG. 4(c) is a diagram showing a step in forming SiO₂ film on the PMSS film using the ion beam assisted deposition apparatus.

Next, as shown in FIG. 4(c), a SiO₂ film is formed with a thickness of about 200 nm on the PMSS film 19 using the ion beam assisted deposition apparatus shown in FIG. 2. In this case, the heating temperature of the Si substrate 16 ranges from room temperature to 400° C., the acceleration voltage of ions is 1.25 kV and the pressure of oxygen (O₂) or argon (Ar) gas is $3-6 \times 10^{-5}$ Torr. The quartz powder (SiO₂) set in the crucible 12 as the evaporation source 11 is heated by an electron beam gun and the SiO₂ film 20 is formed on the PMSS film 19 by the vaporized SiO₂.

If a silicon nitride film is formed in place of the SiO₂ film 20, Si is used as the evaporation source 11 and nitrogen gas is supplied to the ion source 14.

Figure 4D:
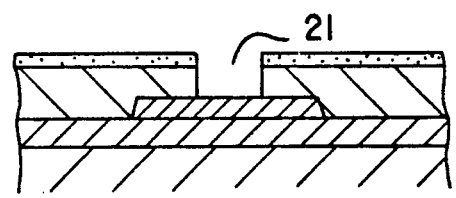
FIG. 4(d) is a diagram showing a step in forming a via hole by simultaneously opening the SiO₂ film and the PMSS film.

Thereafter, as shown in FIG. 4(d), the SiO$_2$ film 20 and the PMSS film 19 are simultaneously etched by the RIE (Reactive Ion Etching) method using a resist mask to form the via hole 21. In this case, the fluorine containing reactant gas such as tetrafluoromethane (CF$_4$), hexafluoroethane (C$_2$F$_6$) or trifluoromethane (CHF$_3$) is used, under a pressure set to 2 Torr, a frequency set to 13.56 MHz and an applied power of 300W.

Figure 4E:
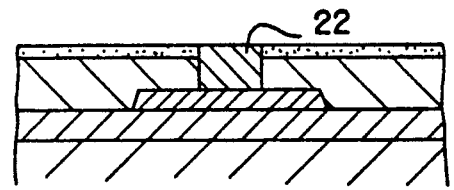
FIG. 4(e) is a diagram showing a step in selectively depositing the tungsten W film in the via hole by the CVD method.

Next, as shown in FIG. 4(e), the tungsten W film 22 is selectively deposited in the via hole 21 using the CVD method. When the CVD method is used, a mixed gas of tungsten hexafluoride (WF$_6$), silane (SiH$_4$) and hydrogen (H$_2$) is applied, and the substrate temperature is set in the range of 200° C. to 400° C., more desirably from 250° C. to 310° C. The flow rates of WF$_6$, SiH$_4$, and hydrogen (H$_2$) are respectively set to 10, 4 and 40 SCCM, but these values are not severely restricted. Namely, the flow rate of WF$_8$ is allowed to be in the range of 2 to 10 SCCM and that of SiH$_4$ is allowed to be in the range of 2 to 10 SCCM. Selectivity of tungsten for CVD is better as the substrate temperature is lower. Moreover, selectivity improves as the mixing ratio of the reactant gas, namely SiH$_4$/(SiH$_4$+WF$_6$) is made smaller.

It is also possible to selectively deposit molybdenum (Mo) in place of tungsten to the contact hole 21. In this case, MoF$_8$ is used in place of WF$_6$.

Figure 4F:
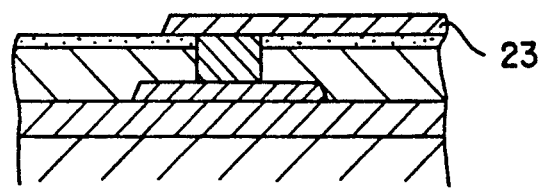
FIG. 4(f) is a diagram showing a step in forming a second metal wiring film by Ti/Au film on the W film and SiO₂ film by the sputtering method.

Finally, as shown in FIG. 4(f), like the first metal wiring 18, the Ti film with a thickness of 10 nm and Au film with a thickness of 700 nm are sequentially formed, by the sputtering method, on the SiO$_2$ film 20 covering the tungsten film 22, and it is then patterned to form the second metal wiring film 23.

In this preferred embodiment, Ti/Au is used as the first metal wiring film 18 and a second metal wiring film 23, but it is also possible to use TiW/Au, Ti/Au/Pt, TiW/Au/TiW, TiW/Au/Mo, Al, W, polysilicon, or metal silicide film.

The two-level interconnect structure is formed as explained above, but a multilevel interconnect structure may also be formed by repeating such processes.

Figure 5:
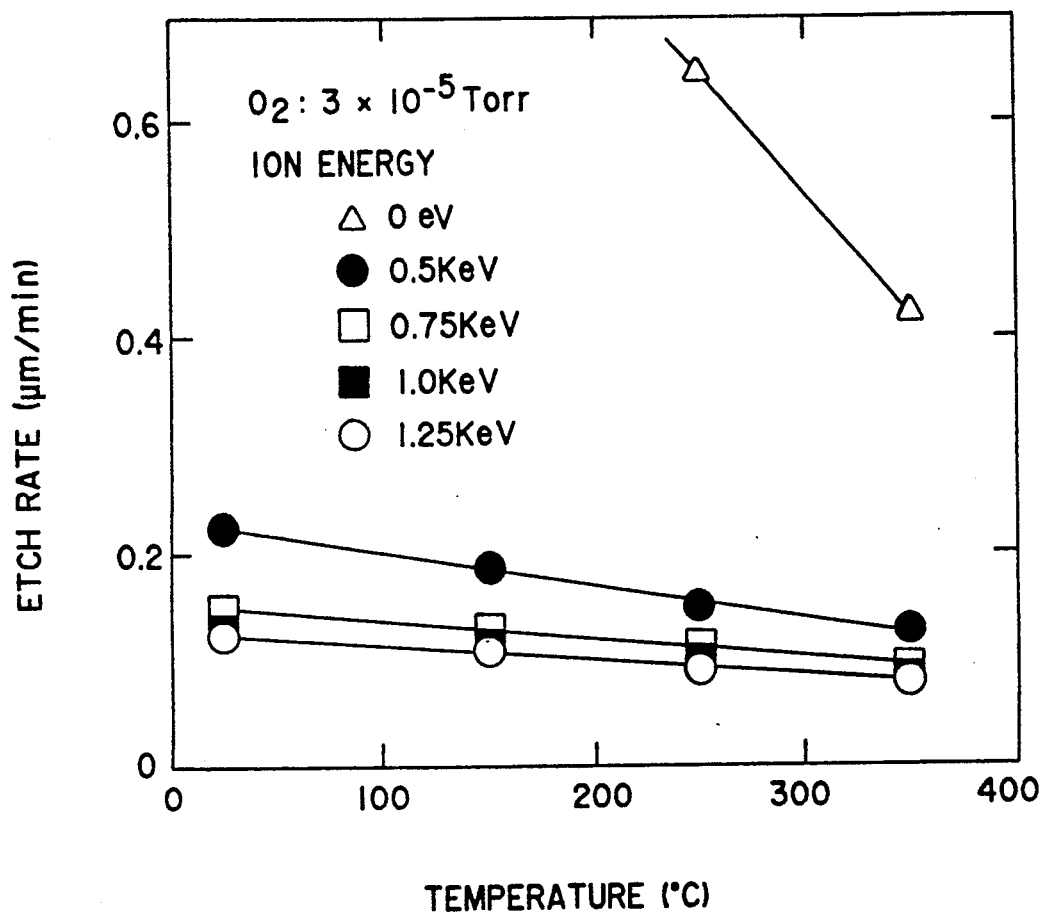
FIG. 5 is a diagram showing the relationship between the etch rate and the substrate temperature when the SiO₂ film is formed using the oxygen ion beam assisted method and is etched by an aqueous solution of HF.

FIG. 5 is a graph indicating the density of a SiO$_2$ film 20 which has been formed by the method indicated in FIG. 4(c). The vertical axis of this graph indicates an etching rate when a SiO$_2$ film is etched with hydrofluoric acid at room temperature, while the horizontal axis indicates a substrate temperature when a SiO$_2$ film is formed using the oxygen ion beam assisted deposition method. In this graph, the relationship between the etching rate and the substrate temperature is shown for the oxygen ion beam energy of 0, 0.5, 0.75, 1.0 and 1.25 KeV.

When the oxygen ion beam energy is 0 KeV, namely there being no ion beam assist effect, an etching rate for the substrate temperature of 300° C. is about 0.5 μm/min. Meanwhile, when the oxygen ion beam energy is 0.75 KeV or more, the etching rate for the substrate temperature of 300° C. is about 0.1 μm/min and the etching rate for the substrate temperature as low as 100° C. is about 0.2 μm/min or less.

As explained above, the SiO$_2$ film by the oxygen ion beam assisted deposition method shows an increase in the density of the SiO$_2$ film with oxygen ion energy.

Figure 6:
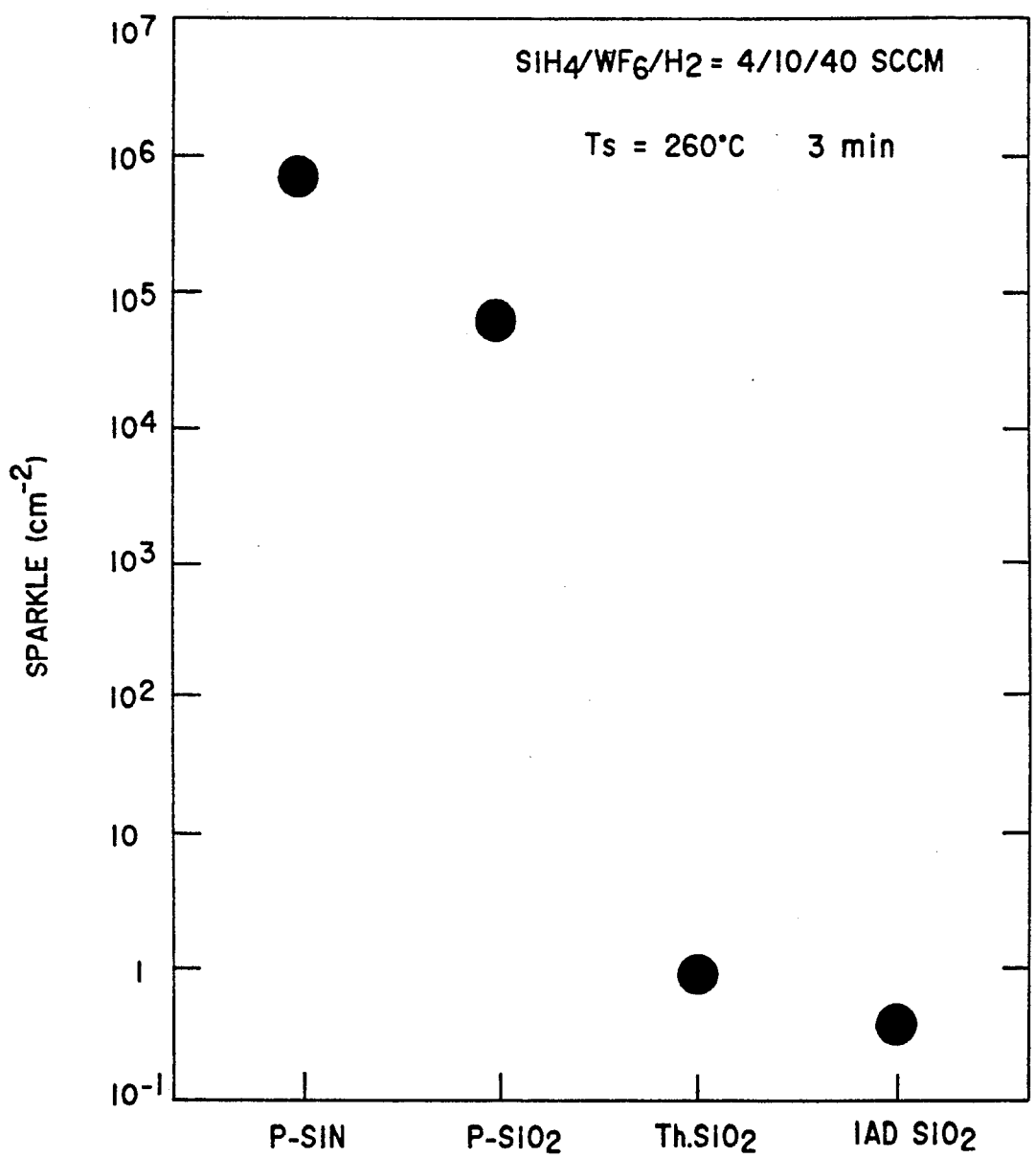
FIG. 6 is a diagram comparing the density of sparkle in tungsten W that is deposited under similar conditions using the CVD method on the four kinds of dielectric films.

FIG. 6 is a graph for evaluating the selectivity of the selective CVD method using tungsten W obtained in FIG. 4(3) of this preferred embodiment. FIG. 6 shows the results when the tungsten W film is deposited by the CVD method on the SiO$_2$ film using the plasma method, thermal oxidization method or ion beam assisted deposition method on p-SiO$_2$, Th-SiO$_2$, IAD-SiO$_2$, respectively, and the SiN film using the plasma method on p-SiN. Here, the growth condition of W using the CVD method is as follows. The flow rates of reactant gases SiH$_4$, WF$_6$, and H$_2$ are respectively 4, 10 and 40 SCCM, the substrate temperature is held at 260° C. and growth time is set to 3 min.

The black circles of FIG. 6 indicate densities of sparkles (tungsten nuclei) formed on the dielectric films. In this CVD, sparkles of $10^4$ to $10^6$ cm$^{-2}$ are formed on the p-SiN, p-SiO$_2$ respectively but the sparkles as little as 1 cm$^{-2}$ are formed on the Th-SiO$_2$ and the sparkles as little as 0.3 cm$^{-2}$ on the IAD-SiO$_2$.

From the fact that the amount of sparkle deposited on IAD-SiO$_2$ is small, the SiO$_2$ film formed using the ion beam assisted deposition method is proven to have excellent selectivity using the selective CVD method.

A small amount of sparkles are formed on Th-SiO$_2$, but since the temperature as high as about 1000 ° C. is required to form the SiO$_2$ film using the thermal oxidation method, it is not a suitable method for forming wirings in the manufacture of high-density and large-scale integrated circuits.

In this preferred embodiment, the PMSS film is used as the dielectric film 20, but it is also possible to further provide inorganic dielectric films such as SiO$_2$ film, Si$_3$N$_4$ film and SiON$_x$ (silicon oxide nitride) film under the PMSS film, or to apply the SOG film or polyamide film in place of the PMSS resin.

Moreover, when the surface is flat, the effect of the present invention may also be obtained even when the single layer of dielectric film formed by the ion beam assisted deposition method is employed.

In addition, the Si substrate is used in this preferred embodiment but a compound semiconductor substrate may also be used. The present invention can also be applied to the gate electrode wiring of field effect transistors (FET) of compound semiconductors such as GaAs, A l GaAs.

What is claimed is:

1. A method of selectively forming conductive material on a substrate, said method comprising the steps of:
   forming a first dielectric film layer on the substrate;
   forming a second dielectric film layer as an upper most layer on top of said first dielectric film layer using a beam-assisted deposition method;
   selectively forming a via hole through said first dielectric film layer and said second dielectric film layer; and
   selectively depositing a conductive material film in said via hole whereby said conductive material film does not substantially grow on said first dielectric film layer and said second dielectric film layer.

2. A method of according to claim 1, said method further comprising the steps of:
   forming a first conductive material wiring between the substrate and said first dielectric film layer, whereby said first conductive material wiring is in contact with said conductive material film filled in said via hole; and
   forming a second conductive material wiring on said second dielectric film layer covering said conductive material film filled in said via hole.

3. A method of according to claim 1 or 2, wherein the substrate is selected from the group comprising silicon semiconductor material or a compound semiconductor, conductive material and insulator material.

4. A method according to claim 1, further comprising the step of:

forming a third dielectric film layer on the substrate and under said first dielectric film layer whereby said first dielectric film layer is selected from the group comprising PMSS (silylated polymethyl silsesquioxane) film, polyimide film and SOG film, and said third dielectric film layer is selected from the group comprising silicon dioxide, silicon nitride, and silicon oxide nitride.

5. A method according to claim 4, wherein said second dielectric film layer is selected from the group comprising silicon dioxide and silicon nitride.

6. A method according to claim 1, 4 or 5, wherein said via hole is formed by the RIE (reactive ion etching) using fluorine containing reactant gas.

7. A method according to claim 1, wherein said conductive material film is selected from the group comprising tungsten and molybdenum formed by a selective CVD (chemical vapor deposition) method.

8. A method according to claim 2, wherein said first and second conductive material wirings are selected from the group comprising double layered structure film of titanium (Ti)/gold (Au), titanium tungsten (TiW)/Au, triple layered structure film of TiW/Au/TiW, TiW/Au/molybdenum (Mo), Ti/Au/platinum (Pt) and single layer of aluminum (Al), tungsten W, polysilicon and metal silicide.

9. A method according to claim 4, wherein said first dielectric film layer is formed by annealing PMSS coated on a silicon substrate using a spin coating method for an hour at 350° C., said first dielectric film layer being formed with a thickness of about 1.5 μm.

10. A method according to claim 5, wherein said second dielectric film layer is formed with a temperature of the substrate in the range from room temperature to 400° C. using an oxygen ion beam assisted deposition method, oxygen ions being accelerated by a voltage of 1.25 KV.

11. A method according to claim 1 or 7, wherein the selective CVD of tungsten is carried out using a mixed gas of tungsten hexafluoride ($WF_6$), Silane ($SiH_4$) and hydrogen ($H_2$) as a reactant gas with a temperature of the substrate in the range from 200° to 400° C.

12. A method according to claim 8, wherein said first and second conductive material wirings are formed from titanium-gold using a sputtering method depositing a titanium film with a thickness of 10 nm followed by depositing a gold film with a thickness of 700 nm.

13. A method according to claim 10, wherein said second dielectric film layer is formed with a temperature of the substrate in the range from 200° to 310° C.

14. A method according to claim 11, wherein the selective CVD of tungsten is carried out with a temperature of the substrate in the range from 250° to 310° C.

15. A method according to claim 1, wherein forming said second dielectric film layer as an upper most layer using an ion beam-assisted deposition method produces a nucleation site density of 0.3 nuclei per square centimeter.

* * * * *